United States Patent
Point et al.

(10) Patent No.: US 7,145,384 B2
(45) Date of Patent: Dec. 5, 2006

(54) PULSE LENGTH MATCHED FILTER

(75) Inventors: Robert Warren Point, Groveland, MA (US); Robert Ian Gresham, Somerville, MA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/890,361

(22) Filed: Jul. 13, 2004

(65) Prior Publication Data

US 2006/0012432 A1    Jan. 19, 2006

(51) Int. Cl.
   H03F 1/02     (2006.01)
   H03F 3/45     (2006.01)
(52) U.S. Cl. .......................................... 330/9; 330/258
(58) Field of Classification Search ................ 330/258; 327/337
   See application file for complete search history.

(56) References Cited

U.S. PATENT DOCUMENTS

| 5,805,110 A | * | 9/1998 | McEwan | 342/387 |
| 6,067,040 A | | 5/2000 | Puglia | 342/134 |
| 6,587,072 B1 | | 7/2003 | Gresham et al. | 342/70 |

FOREIGN PATENT DOCUMENTS

WO    WO 00/43801    7/2000
WO    WO03012983 A1 *    2/2003 .................... 330/9

OTHER PUBLICATIONS

Vorenkamp, Pieter and Verdaasdonk, Johan P.M., Fully Bipolar, 120-Msample/s 10-b Track-and-Hold Circuit, IEEE Journal of Solid-State Circuits, Jul. 1992, vol. 27, pp. 987-992.
Gray, Paul R., Hurst, Paul J., Lewis, Stephen H., Meyer, Robert G., "Analysis and Design of Analog Integrated Circuits, 4th ed.," pp. 809-857, 2001.
Stout, David F., "Handbook of Operational Amplifier Circuit Design," pp. 3-1 to 3-38 and 15-9 to 15-12, 1976.
Razavi, Behzad, "Design of a 100-MHz 10-mW 3-V Sample-and-Hold Amplifier in Digital Bipolar Technology," IEEE Journal of Sold-State Circuits, vol. 30, No. 7, Jul. 1995.
Walder, J-P et al: "A low power, wide dynamic range multigrain signal processor for the SNAP CCD" vol. 5 of 5, Oct. 19, 2003, pp. 1-5 Voll, XP010740205.
Castello R et al: "A High-Performance Micropower Switched-Capacitor Filter" vol. SC-20, No. 6 Dec. 1985, pp. 1122-1132, XP002026671.
Shouli Yan et al: "A continuous-time/spl 1-9 Sigma spl Delta/ modulator with 88d8 dynamic range and 1.1MHz signal bandwidth" Feb. 9, 2003, pp. 1-10, XP010661573.

* cited by examiner

Primary Examiner—Steven J. Mottola

(57) ABSTRACT

A receiver circuit including a differential amplifier and at least one common mode feedback circuit coupled to the differential amplifier for providing a control current to the differential amplifier for regulating a common mode voltage of the differential amplifier. The receiver circuit provides integration and sampling on an input signal, and may be used as a portion of a sensor circuit.

11 Claims, 7 Drawing Sheets

PULSE LENGTH MATCHED FILTER

FIELD OF THE INVENTION

This present invention relates to filters, and in particular, to an integrator for use in matched filter applications, such as a short range radar system.

BACKGROUND OF THE INVENTION

A need exists for a short-range radar system, which, for example, is suitable for automotive and other commercial applications. Such a system would be enabled to sense the proximity of other vehicles and objects, whether moving or stationary, within a range of about 0.15–30.0 meters.

U.S. Pat. No. 6,067,040 describes one conventional high resolution radar-based detection system. The system employs a 'transmit' channel which is connected to a first narrow pulse modulator 104, and emits pulse modulated transmit signals having a prescribed frequency and duration. The 'receive' channel is coupled to a second narrow pulse modulator 105 which assists in extracting the original transmit signals from the pulse modulated transmit signals reflected off an object (at range R) and received at the receive channel antenna. A time delay ($\tau$) circuit delays the output of the second narrow pulse modulator 105 to the receive channel (so that the signal produced by the second narrow pulse modulator 105 is preferably in phase alignment with the reflected pulse modulated transmit signal received at the receive channel antenna), and a mixer 402 mixes the reflected pulse modulated transmit signals with the output of the second narrow pulse modulator 105 to produce the original (non-modulated) transmit signals.

In order to increase the range of a radar-based detection system (such as described above), the signal energy (power) of the transmitted signal must be increased. However, there are at least two limitations that restrict the amount of energy (power) that may be transmitted by a sensor system, such as the radar-based detection system described above. The first limitation is that the ability to discriminate between two targets (range discrimination) is a function of pulse length in pulsed radar systems. The second limitation is the 'chirp' or frequency modulation bandwidth in a continuous wave (CW) radar system. A longer pulse length increases the amount of energy transmitted by the sensor with a consequent reduction in the ability of the sensor to discriminate between closely located objects. Also, the interval between pulses may not be reduced indiscriminately to increase the transmitted energy (power) due to the need to maintain an unambiguous range measurement.

Additionally, a sensor system as described above is susceptible to in-band interference sources that produce electromagnetic (E-M) energy in same portion of the E-M spectrum as the sensor operates. The interfering sources include CW or pulsed transmissions by other systems, mutual interference from a second sensor or sensor system, self-jamming caused by imperfect isolation between the transmit and receive channels, and wide band thermal noise.

The use of such a sensor system in the automotive industry becomes particularly problematic due to sheer volume of automobiles which may occupy a particular space at any one time (e.g., highway). For example, hundreds of cars on a single highway may all be generating and receiving sensor signals in the same frequency range.

U.S. Pat. No. 6,587,072 describes a radar-based sensor system which eliminates some of the above-mentioned deficiencies. The system shown in FIG. 1 of the '072 Patent includes a 'transmit' arm including a signal source 10, a frequency correction module 11, a buffer amplifier 12, a pulse former 13, a resistive element 14, a switch driver 15, a bi-phase modulator 16, a modulator driver 17, output amplifiers 25 and 26, variable gain control 27, and a switch driver 28. A 'receive' arm of the system includes low noise amplifiers (LNAs) 40 and 41, phase shifter 43, mixers 44 and 45, integrator circuits 47 and 48, doppler filters 49 and 50, sampler circuit 51, switches 52 and 54, and integrator circuits 53 and 55.

A transmit-receive select switch 18 selects which arm (e.g., 'transmit' or 'receive') of the system is in operation at any particular time. When the 'transmit' arm is in operation, transmit antenna 30 sends signals toward an object 35. When the 'receive' arm is in operation, receive antenna 31 receives signals which are reflected back from the object 35. A benefit of the sensor system is that it may transmit pulses of differing pulse lengths to increase the range of the system. For example, if one pulse is defined as a 'chip', the pulse length may be increased to 3 chips, 7 chips, 11 chips, and so on, to accurately identify objects which are farther away. Additional specifics of the radar-based sensor system are described in detail in the '072 Patent, and are incorporated herein by reference.

However, the radar-based sensor system described in the '072 Patent requires an integrator which can accurately integrate over variable pulse widths (e.g., 1 chip, 3 chips, 5 chips, etc.).

Thus, there is presently a need for an integrator which can accurately and efficiently integrate pulses with various pulses widths.

SUMMARY OF THE INVENTION

An exemplary embodiment of the present invention comprises a circuit including a differential amplifier and at least one common mode feedback circuit coupled to the differential amplifier for providing a control current to the differential amplifier for regulating a common mode voltage of the differential amplifier, wherein the differential amplifier is operable in at least one of at least two modes, such that in a first mode of the at least two modes the differential amplifier is operable to perform integration of a signal, and in a second mode of the at least two modes the differential amplifier is operable to hold at least one sample representative of a previously integrated signal.

An exemplary embodiment of the present invention also comprises a circuit including an amplifier portion for amplifying an input signal to produce an amplified input signal, an integration portion for integrating the amplified input signal to produce an integrated signal, and a sample and hold portion for sampling and holding at least one voltage value representing a portion of the integrated signal, wherein the circuit is operable in at least one of at least two modes, such that in a first mode of the at least two modes the circuit is operable to perform integration of the amplified input signal, and in a second mode of the at least two modes the circuit is operable to hold at least one sample representative of a previously integrated signal.

An exemplary embodiment of the present invention also comprises a radar-based sensor system including a transmitter and a receiver, the receiver comprising a differential amplifier and at least one common mode feedback circuit coupled to the differential amplifier for providing a control current to the differential amplifier for regulating a common mode voltage of the differential amplifier, wherein the differential amplifier is operable in at least one of at least two modes, such that in a first mode of the at least two modes the differential amplifier is operable to perform integration of a signal, and in a second mode of the at least two modes the differential amplifier is operable to hold at least one sample representative of a previously integrated signal.

DETAILED DESCRIPTION

Figure 1:
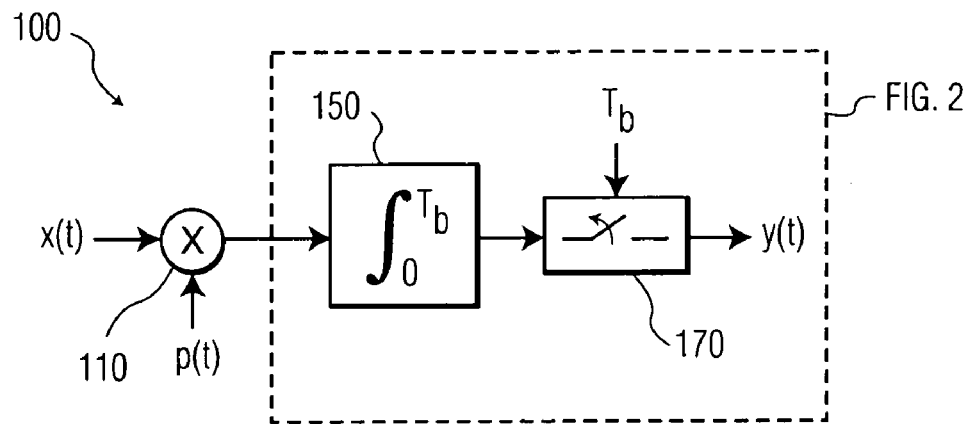
FIG. 1 shows a block diagram of a receive arm of a radar-based sensor system according to an exemplary embodiment of the present invention.

FIG. 1 shows a simplified block diagram of a 'receive' arm 100 of a radar-based sensor system according to an exemplary embodiment of the present invention. The receive arm 100 may comprise the receive arm of the radar-based sensor system, such as the system described above with reference to U.S. Pat. No. 6,587,072. However, for ease of discussion, only one of the channels of the receive arm shown in the '072 Patent (e.g., Q channel) are described herein; those of ordinary skill in the art will realize that the receive arm 100 described herein may be used for both the I and Q channels shown in the '072 Patent. The receive arm 100 is intended to operate in conjunction with Ultra Wide Band (UWB) signals (e.g., open loop bandwidth greater than 3 GigaHertz (GHz)) from an associated 'transmit' arm, but may operate within any suitable frequency range.

The receive arm 100 is comprised of a mixer portion 110, an integrator portion 150, and a sampling portion 170. The mixer portion 110 receives a modulated signal x(t) and local oscillator (LO) signal p(t), and correlates (multiples) the signals to produce an output signal. The modulated signal x(t) preferably comprises a signal transmitted by an associated 'transmit' arm (not shown in FIG. 1) which has been reflected off an object (not shown). The LO signal p(t) preferably comprises a delayed version of the carrier signal used to modulate the transmitted signal in the 'transmit' arm. Hence, the output signal preferably comprises a demodulated version of the signal transmitted by the 'transmit' arm.

The output signal from the mixer portion 110 is applied to the integrator portion 150 where the signal is integrated over a finite time period from t=0 to t=$T_b$, where $T_b$ equals the time to process a certain number of 'chips,' where a 'chip' is defined as a single sub-pulse within a larger pulse of specific pulse length (duration). Whereas one (1) 'chip' may comprise the minimum pulse length available for transmission by the 'transmit' arm, pulse length (and thus range) may be increased by increasing the number of 'chips' in the transmitted pulse (e.g., 3 chips, 5 chips, 7 chips, etc.). Typically, one 'chip' has a pulse length of 0.5 nanoseconds (nS), but a pulse could contain several 'chips' from 1 to 13 (or 0.5 nS to 6.5 nS), corresponding to a bandwidth variation of 153 MegaHertz (MHz) to 2 GigaHertz (GHz), which is in excess of one 'decade' (e.g., 10 MHz). The receive arm 100 is variable over such a range of bandwidths, in contrast to conventional filter topologies, which could not accommodate that level of variation.

The sampling portion 170 samples each integrated 'chip' or series of 'chips and produces a sampled output, y(t). In particular, the sampling portion 170 includes a switch which remains open during the integration from 0–$T_b$, and then closes when $T_b$ is reached which couples the integrated signal through to the output of the sampling portion.

Figure 2:
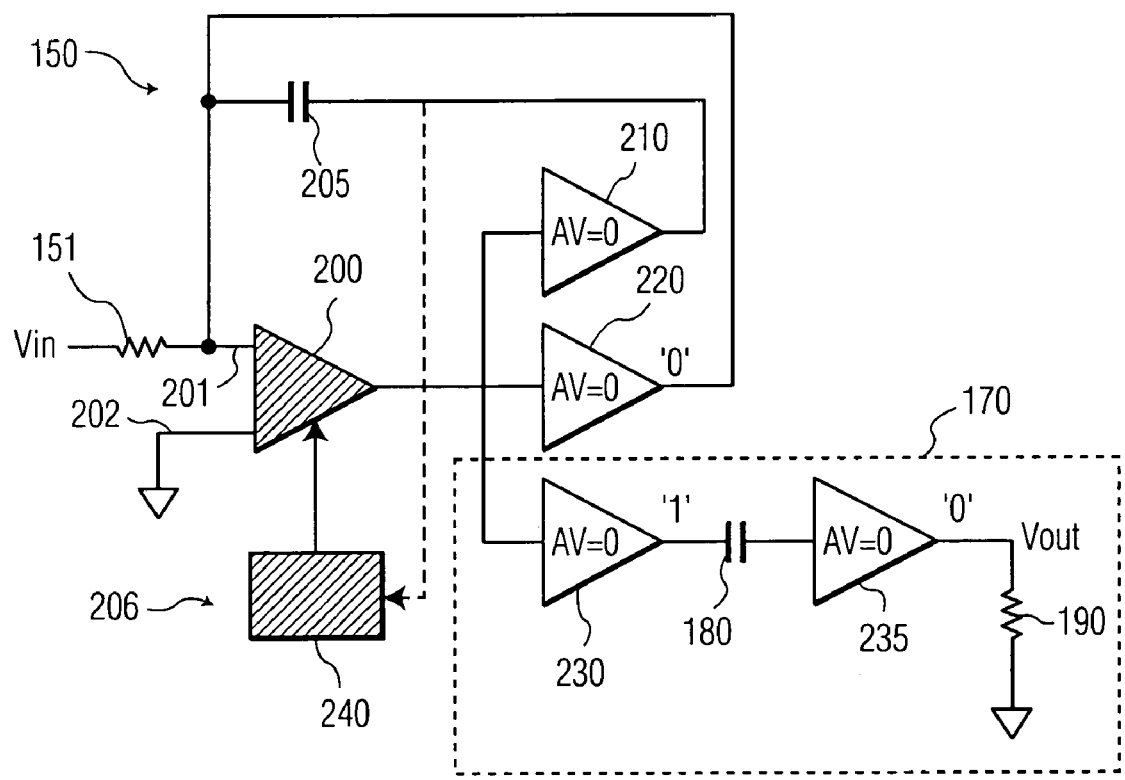
FIG. 2 shows a block diagram of the receive arm shown in FIG. 1 in greater detail.

FIG. 2 shows a portion of the receive arm 100 in more detail with virtual grounds (i.e. differential circuit implementation). In particular, FIG. 2 shows the integrator portion 150 and the sampling portion 170 of the receive arm 100. The integrator portion 150 of the receive arm 100 comprises a main differential amplifier 200 which includes a first input terminal 201 which receives an input analog voltage signal $V_{in}$ from the mixer portion 110 shown in FIG. 1. A second input terminal 202 of the differential amplifier 200 is coupled to a virtual ground. The integrator portion 150 also includes a Common Mode Feedback (CMFB) circuit 240.

The integrator portion 150 includes an input resistor 151, a feedback capacitor 205, and at least two first buffer amplifiers 210, 220. Similarly, the sampling portion 170 includes at least two second buffer amplifiers 230, 235. The sampling portion 170 also includes a first sampling capacitor 180, and a first load resistor 190 for measuring the voltage present at the output of the receive arm 100. An output voltage signal $V_{out}$ is produced at the output of the buffer amplifier 235. This output voltage signal $V_{out}$ was previously referenced as y(t) in FIG. 1.

FIG. 2 shows exemplary binary control signals for the receive arm 100 which specify a mode of the main differential amplifier 200. For example, a logic '0' control signal is provided at buffer amplifier 220 and buffer amplifier 235, and a logic '1' is provided at buffer amplifier 230, to specify a first mode. If a logic '1' is provided at buffer amplifier 220 and buffer amplifier 235, and a logic '0' is provided at the buffer amplifier 230, a second mode is specified.

Figure 3:
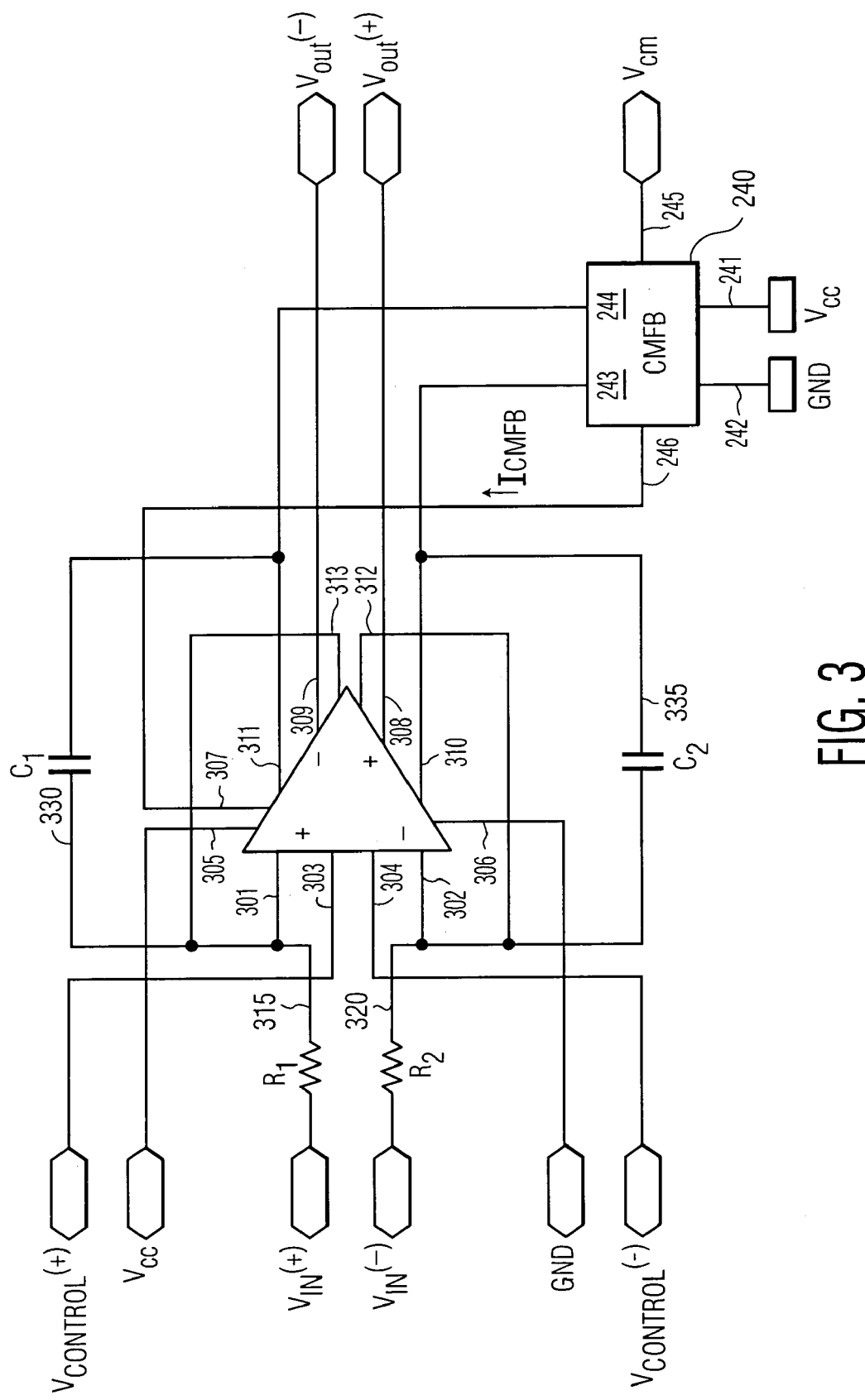
FIG. 3 shows a block diagram of the receive arm shown in FIG. 2 in greater detail.

FIG. 3 shows a block diagram of the receive arm 100 in even greater detail. Particularly, the differential amplifier 200 (and its associated components) is shown in greater detail, as differential amplifier 300. The differential amplifier 300 includes all the functions of the integrator portion 150 and the sampling portion 170 described above with reference to FIG. 2 (except for the functions performed by the CMFB circuit 240, which performs the same operation in both FIGS. 2 and 3).

The differential amplifier 300 preferably includes at least five (5) input terminals, including a positive voltage input terminal ($V_{IN}$+) 301, a negative voltage input terminal ($V_{IN}$−) 302, a positive control terminal ($V_{CONTROL}$+) 303, a negative control terminal ($V_{CONTROL}$−) 304, and a current reference input terminal ($I_{REF}$) 307.

A voltage signal applied to the differential control terminals ($V_{CONTROL}$+, $V_{CONTROL}$−) 302, 303 controls whether the amplifier 300 is in one of two states (modes): Integrate/Sample (I/S) Mode or Reset/Hold (R/H) Mode. For example, if a voltage of +3 Volts (V) were applied to the negative control voltage terminal ($V_{CONTROL}$−) 304, and a voltage of +2V were applied to the positive control voltage terminal ($V_{CONTROL}$+) 303, then the amplifier 300 would be in I/S Mode. Similarly, if a voltage of 3 Volts (V) were applied to the positive control voltage terminal ($V_{CONTROL}$+) 303, and a voltage of 2V were applied to the negative control voltage terminal ($V_{CONTROL}$−) 304, then the amplifier 300 would be in R/H Mode. Of course, those of ordinary skill in the art will realize that the reverse of the above-mentioned arrangement would achieve the same result and is also contemplated herein.

In I/S Mode, an input signal (single pulse or series of pulses) provided at the differential input terminals ($V_{IN}$+, $V_{IN}$−) 301, 302 is integrated over a specific time period (e.g., $0-T_b$, which is equal to the length of the single pulse or series of pulses), and a sample corresponding to the integration result is generated. The integration is preferably performed by the R-C networks 315, 330 and 320, 335, and differential amplifier 300, as explained below.

In R/H Mode, the sampled integration result (produced in I/S Mode) is held (e.g., across a capacitor), and the integrators (e.g., R-C networks 315, 330 and 320, 335) are reset in preparation for the next integration.

In either I/S or R/H Mode, an input voltage signal (from a mixer portion 110) is preferably coupled to the differential input terminals ($V_{IN}$+, $V_{IN}$−) 301, 302 of the amplifier 300 through the resistors 315, 320. The input voltage signal may comprise a single pulse, or a series of pulses, generated by the correlation of a transmitted signal reflected off an object, and a delayed version of the original signal generated by the mixer portion 110, as described in U.S. Pat. No. 6,587,072, which is incorporated herein by reference. The differential amplifier 300 output provided at the compensating capacitor voltage terminals ($V_{OCC}$+, $V_{OCC}$−) 310, 311 is preferably coupled to capacitors ($C_1$, $C_2$) 330, 335. The capacitors ($C_1$, $C_2$) 330, 335, in conjunction with the differential amplifier 300 and resistors 315, 320, form a basic R-C integrator. In I/S Mode, a signal to be integrated is fed back from the output of the amplifier 300 (e.g., $V_{OCC}$+, $V_{OCC}$−) through these R-C networks 315, 330 and 320, 335, as explained in detail below.

The amplifier 300 also includes a power terminal ($V_{CC}$) 305, and a ground terminal (GND) 306. The power terminal 305 may be coupled to a voltage source (e.g., +5 Volts), as is well known in the art. Additionally, as explained below, a current reference signal is preferably generated by the CMFB circuit 240, and provided at the current reference input terminal ($I_{REF}$) 307 of the amplifier 300.

The amplifier 300 also includes six (6) output terminals, including a positive voltage output terminal ($V_{OUT}$+) 308, a negative voltage output terminal ($V_{OUT}$−) 309, a positive output compensating capacitor voltage terminal ($V_{OCC}$+) 310, a negative output compensating capacitor voltage terminal ($V_{OCC}$−) 311, a positive switch terminal ($SW_P$) 312, and a negative switch terminal ($SW_N$) 313.

In I/S Mode, a differential output signal, which is the 'integral' of the input signal provided at the differential input terminals ($V_{IN}$+, $V_{IN}$−) 301, 302, is provided at the compensating capacitor voltage terminals ($V_{OCC}$+, $V_{OCC}$−) 310, 311, and is integrated by the R-C networks ($C_1/R_1$) 315, 330 and ($C_2/R_2$) 320, 335, respectively. When the amplifier 300 is in R/H Mode, a feedback signal generated at the differential switch terminals ($SW_P$, $SW_N$) 312, 313 is fed back to the differential input terminals ($V_{IN}$+, $V_{IN}$−) 301, 302 so as to cancel out the input voltage signal. In particular, a signal which is identical to the input signal but which is 180° out of phase therewith (and includes gain) is continually generated at the differential switch terminals ($SW_P$, $SW_N$) 312, 313. When the amplifier 300 enters R/H Mode (from I/S Mode), this 180° phase-shifted signal is coupled to the input so as to 'cancel out' the input wave, and thus make any resulting integration of the two waves essentially equal to zero (0).

The CMFB circuit 240 operates to specify a common mode voltage for the amplifier 300. The CMFB circuit 240 includes a power terminal ($V_{CC}$) 241, and a ground terminal (GND) 242. The CMFB circuit 240 also includes differential voltage input terminals ($V_{INCM}$+, $V_{INCM}$−) 243, 244, and a common mode voltage input terminal ($V_{CM}$) 245.

As noted above, when the differential amplifier 300 is in I/S Mode, the differential voltage input terminals ($V_{INCM}$+, $V_{INCM}$−) 243, 244 are coupled to the capacitors ($C_1$, $C_2$) 330, 335 so as to sense the common mode DC bias voltage at the output of the differential amplifier 300 ($V_{OCC}$+, $V_{OCC}$−), which is identical to the output that is provided to the R-C networks ($C_1/R_1$) 315, 330 and ($C_2/R_2$) 320, 335, and the differential amplifier 300. The common mode voltage input terminal ($V_{CM}$) 245 specifies a particular common mode voltage of the output integrated waveform.

The CMFB circuit 240 has a single output terminal ($I_{CMFB}$) 246 which provides an output current for regulating the common mode voltage of the output integrated waveform produced by the differential amplifier 300. This output current $I_{CMFB}$ is coupled to the differential amplifier 300 at the reference current input terminal ($I_{REF}$) 307 mentioned above.

A common mode voltage (e.g., 1.6 Volts) is preferably provided at the common mode voltage input terminal ($V_{CM}$) 245 of the CMFB circuit 240. This common mode voltage ($V_{CM}$) provides a center point about which the output voltage from the differential voltage output terminals ($V_{OUT}$+, $V_{OUT}$−) 308, 309 is centered. For example, if the common mode voltage is 1.6 Volts, the output voltage waveform would be centered about 1.6 Volts (i.e., if the output voltage waveform were a square wave, one-half of the waveform would be disposed at voltages greater than 1.6 Volts, and one-half of the waveform would be disposed at voltages less than 1.6 Volts).

Figure 4:
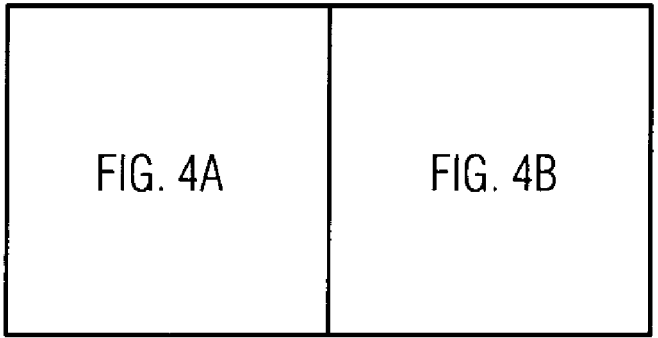
FIG. 4 shows a schematic diagram of the receive arm shown in FIG. 3 implemented in transistor logic.
Figure 4A:
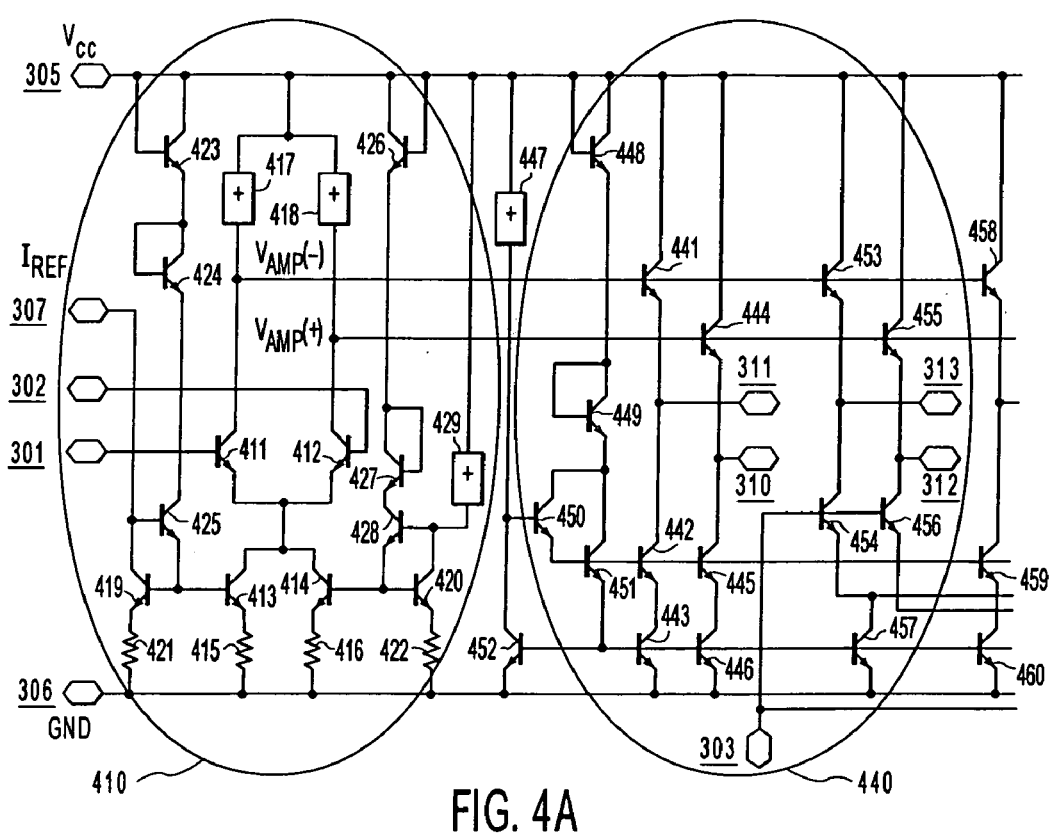
Figure 4B:
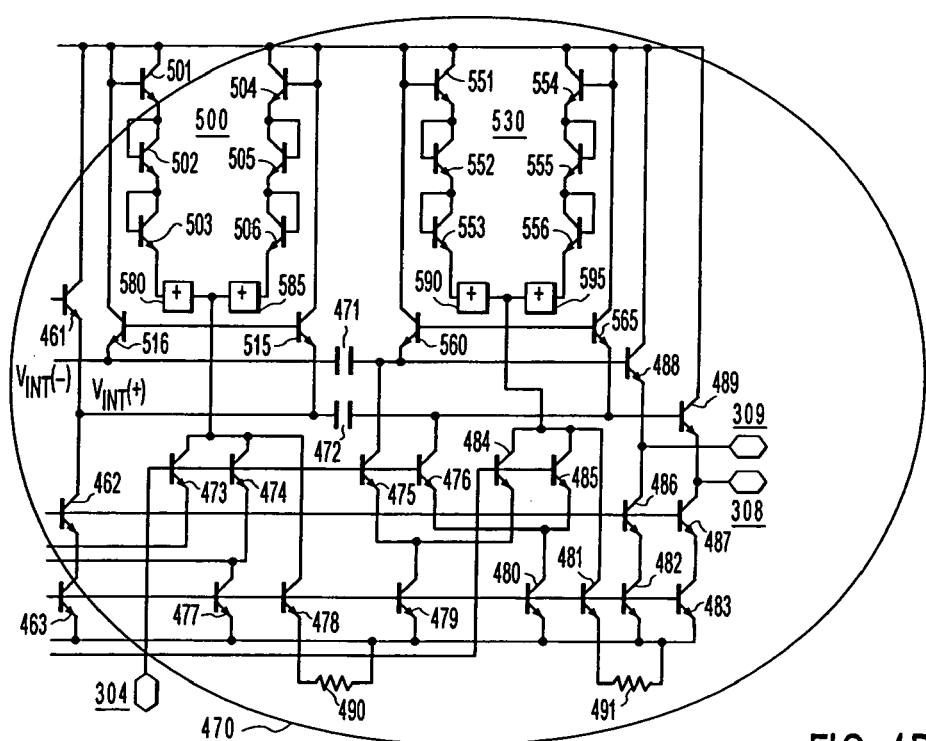

FIG. 4 shows the receive arm 100 (including the differential amplifier 300 of FIG. 3) implemented with transistor logic as receive circuit 400. Preferably, the transistors shown in FIG. 4 are all Negative-Positive-Negative (NPN) Bipolar Junction Transistors (BJTs), but those of ordinary skill in the art will realize that various types of transistor are suitable for forming the receive circuit 400.

The receive circuit 400 is comprised of three main parts: an amplifier portion 410, an integration feedback portion 440, and a sample and hold portion 470. The amplifier portion 410 provides amplification of the input voltage waveform applied to the differential input terminals ($V_{IN}$+, $V_{IN}$−) 301, 302. The integration feedback portion 440 provides integration of the input voltage waveform applied to the differential input terminals ($V_{IN}$+, $V_{IN}$−) 301, 302 when the receive circuit 400 is in Integrate/Sample (I/S) Mode (which corresponds to the I/S Mode described above with reference to FIG. 3). It will be noted that one of the differential control voltage terminals ($V_{CONTROL}$+, $V_{CONTROL}$−) 303, 304, in particular, the control voltage terminal ($V_{CONTROL}$+) 303, is coupled to the integration feedback portion 440, as well as the sample and hold portion 470, while the other differential control voltage terminal, in particular, the control voltage terminal ($V_{CONTROL}$−) 304, is coupled to the sample and hold portion 470. The control signals provided at the differential control voltage terminals ($V_{CONTROL}$+, $V_{CONTROL}$−) 303, 304 steer current and allow transitions from I/S Mode to R/H Mode (which corresponds to the R/H Mode described above with reference to FIG. 3). The sample and hold portion 470 generates a sampled output voltage waveform at the differential voltage output terminals ($V_{OUT}$+, $V_{OUT}$−) 308, 309 based on the integration performed in the integration feedback portion 440 and the amplifier portion 410.

The amplifier portion 410 includes a first differential transistor pair 411, 412 coupled to the differential input terminals ($V_{IN}+$, $V_{IN}-$) 301, 302, respectively. A second differential transistor pair 413, 414 is coupled to the emitter terminals of the first differential transistor pair 411, 412, and act as current sources. The emitter terminals of the second differential transistor pair 413, 414 are coupled to ground (GND) through a first pair of resistors 415, 416. The collector terminals of the first differential transistor pair 411, 412 are coupled to a voltage supply ($V_{CC}$) through a second pair of resistors 417, 418. The base terminals of the second differential transistor pair 413, 414 are coupled to a third pair of transistors 419, 420. The resistors 421, 422 along with the third pair of transistors 419, 420 set the collector current of the first differential transistor pair 411, 412, via the second differential transistor pair 413, 414 (which act as current mirrors), with the resistors 415, 416.

Because the reference current input terminal ($I_{REF}$) 307 is coupled to the transistor 419, the Common Mode control current $I_{CMFB}$ supplied by the CMFB circuit 240 is applied directly to the collector (and ultimately the base via transistor 425) of the transistor 419, and that collector current is, in turn, 'mirrored' in the transistor 413 which provides the total collector current for the first differential transistor pair 411, 412.

A first network of biasing transistors 423–425 are coupled between the voltage supply ($V_{CC}$) and the transistors 413, 419. A second network of biasing transistors 426–428 are also coupled between the voltage supply ($V_{CC}$) and the transistors 414, 420. The second network of biasing transistors 426–428 also includes a resistor 429 coupled to the base of the transistor 428 and to the collector of the transistor 420.

As noted above, the current reference input terminal ($I_{REF}$) 307 provides a bias current ($I_{REF}$) to the collector of the transistor 419 of the third transistor pair 419, 420, and the base of the transistor 413 of the second transistor pair 413, 414. This bias current may be altered by the CMFB circuit 240 which provides a Common Mode control current ($I_{CMFB}$) to the current reference input terminal ($I_{REF}$) 307. An output signal ($V_{AMP}(+)$, $V_{AMP}(-)$) from the amplifier portion 410 is provided to the integration feedback portion 440 at the collector terminals of the first differential transistor pair 411, 412.

Figure 5:
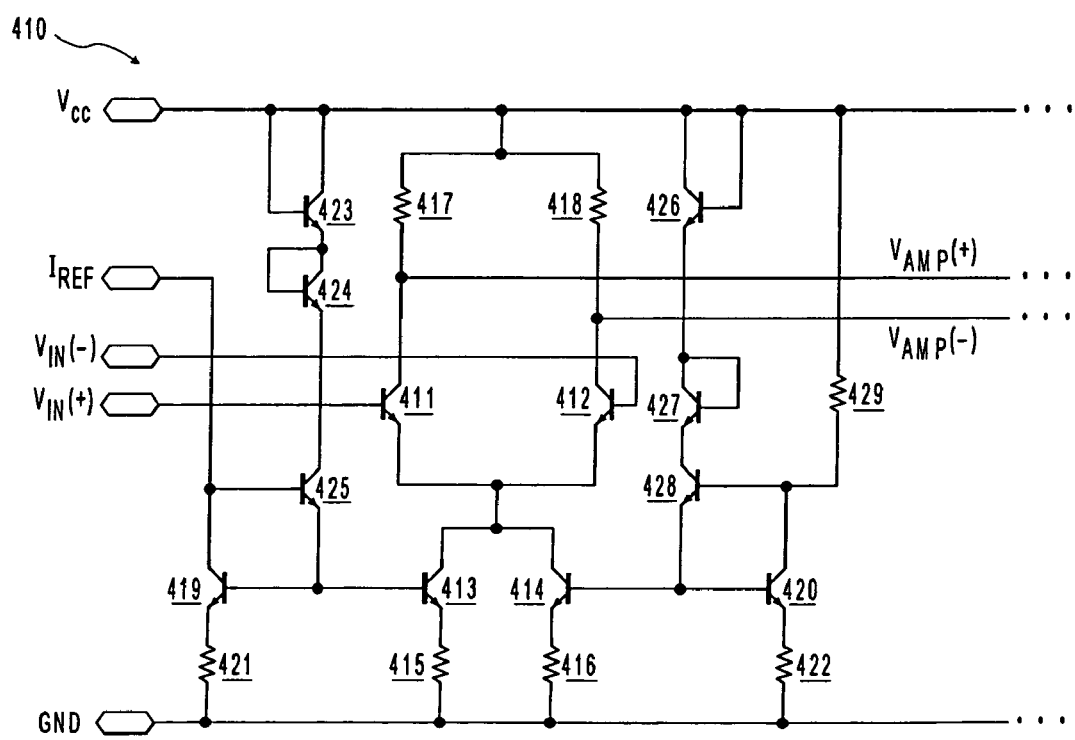
FIG. 5 shows a schematic diagram of an amplifier portion of the receive arm shown in FIG. 4 in greater detail.

FIG. 5 shows the amplifier portion 410 in greater detail. As noted above, a differential voltage output signal $V_{AMP}(+)$, $V_{AMP}(-)$ is provided to the integration feedback portion 440 at the collector terminals of the first differential transistor pair 411, 412. The amplifier portion 410, in conduction with the integration feedback portion 440, and capacitors 471, 472 from the sample and hold portion 470 form the basic elements of an integrator.

Returning to FIG. 4, the integration feedback portion 440 includes a first set of transistors 441–443 and a second set of transistors 444–446 coupled to the differential voltage output signal $V_{AMP}(+)$, $V_{AMP}(-)$ from the amplifier portion 410. The first and second sets of transistors 441–443 and 444–446 operate to provide a differential compensating capacitor output voltage ($V_{OCC}+$, $V_{OCC}-$) at terminals 310, 311 of the differential amplifier 300. The transistors 441 and 444 of the first set of transistors 441–443 act as voltage buffers (as do transistors 453, 455, 458 and 461), such that the output of the transistors 441 and 444 are identical to the output of the transistors 453 and 455 (of third and fourth sets of transistors 453, 454 and 455, 456, described below), except 'switched' to allow the different modes of operation. For example, if the voltage at the control voltage terminal ($V_{CONTROL}+$) 303 is less than the voltage at the control voltage terminal ($V_{CONTROL}-$) 304, then substantially no current flows in the transistors 453, 455, and therefore they are 'switched' OFF. As described above, the differential compensating capacitor output voltage ($V_{OCC}+$, $V_{OCC}-$) is sensed by the CMFB circuit 240, and supplied to the R-C integrator networks ($C_1/R_1$) 315, 330 and ($C_2/R_2$) 320, 335. The integration feedback portion 440 also includes a first resistor 447 and a network of transistors 448–452 coupled between the voltage supply ($V_{CC}$) and ground (GND) for providing requiring biasing.

The differential voltage output signal $V_{AMP}(+)$, $V_{AMP}(-)$ from the amplifier portion 410 is also supplied to the third and fourth sets of transistors 453, 454 and 455, 456. The third and fourth sets of transistors operate to provide a differential switched output voltage ($SW_P$, $SW_N$) at the terminals 312, 313 of the amplifier 300. As noted above, this switched output voltage is preferably identical to the input voltage signal coupled to the differential input terminals ($V_{IN}+$, $V_{IN}-$) 301, 302, except 180° out of phase and amplified. The third set of transistors 453, 454 are coupled to the transistor 457 (which acts as a current source), and the fourth set of transistors 455, 456 are coupled to the transistor 477 (which acts as a current source). The third and fourth sets of transistors 453, 454 and 455, 456 are current steering networks which provide for signal switching, and the transistors 457, 477 act as current sources Additionally, every transistor that is connected to the base of transistor 452 (e.g., transistors 443, 446, 457, 460, 463, 477, 478, 479, 480–483) has a current therein which is a 'mirror' of (i.e., identical to) the current in the transistor 452.

One of the differential control voltage terminals ($V_{CONTROL}+$, $V_{CONTROL}-$) 303, 304 (e.g., "+" terminal 303) is preferably coupled to the bases of the transistors 454 and 456 of the third and fourth sets of transistors 453, 454 and 455, 456, and is also coupled to the bases of transistors 484, 485 of the sample and hold portion 470. The transistors 454 and 456 are the complement of the transistors 473 and 474, and similarly, the transistors 484 and 485 are the complement of transistors 475 and 476. For example, if the transistors 454 and 456 are "ON" (i.e., they have current flowing through them), then the complementary transistors 473 and 474 are "OFF."

The other of the differential control voltage terminals ($V_{CONTROL}+$, $V_{CONTROL}-$) 303, 304 (e.g., "−" terminal 304) is preferably coupled to the sample and hold portion 470, as described in detail below. As noted above, when the voltage applied to a first (e.g., 303) of the differential control voltage terminals 303, 304 is slightly greater than a second (e.g., 304) terminal, the amplifier will be in one of two modes (e.g., I/S Mode). Similarly, when the voltage applied to the second terminal is slightly greater than the voltage applied to the first terminal, the amplifier will be in the other of the two modes (e.g., R/H Mode). Thus, by applying varying control voltages to the differential control voltage terminals 303, 304, the mode of the amplifier 300 may be accurately controlled. In the exemplary receive circuit 400 shown in FIG. 4, the application of a greater voltage to the differential control voltage terminal 303 actuates the R/H Mode, and application of a greater voltage to the differential control voltage terminal 304 actuates the I/S Mode.

Finally, the differential voltage output signal $V_{AMP}(+)$, $V_{AMP}(-)$ from the amplifier portion 410 is supplied to fifth and sixth sets of transistors 458–460 and 461–463. It will be noted that the transistors 441, 444, 453, 455, 458 and 461 are preferably identical transistors which act as voltage buffers. The fifth and sixth sets of transistors 458–460 and 461–463 operate in conjunction with the rest of the integration feedback portion 440 to provide a differential integrated voltage $V_{INT}(+)$, $V_{INT}(-)$ to the first and second sampling capacitors 471, 472 of the sample and hold portion 470.

As the integration of the input waveform proceeds (i.e., while the receive circuit 400 is in I/S Mode), the first and second sampling capacitors 471, 472 are charged with the differential integrated voltage $V_{INT}(+)$, $V_{INT}(-)$. When the integration ceases (i.e., when the receive circuit 400 enters R/H Mode), differential voltage (charge) on the sampling capacitors 471, 472 is translated to the opposite side of the capacitors, as described below, where it is held and provided at the output terminals 308, 309 as differential output voltage $V_{OUT}+$, $V_{OUT}-$.

The negative control voltage terminal ($V_{CONTROL}-$) 304 provides a differential bias signal to the sample and hold portion 470 which is applied to the bases of a first plurality of transistors 473–476. The positive control voltage terminal ($V_{CONTROL}+$) 303 provides a differential bias signal to a third plurality of transistors 484, 485 (as well as the transistors 454 and 456 in the integration feedback portion 440, as explained above). A first resistor 490 is coupled to the emitter terminal of transistor 478 of the second plurality of transistors to maintain a current for the bias circuit (transistor bank) 500. Similarly, a second resistor 491 is coupled to the emitter terminal of transistor 481 of the second plurality of transistors to maintain a current for the bias circuit (transistor bank) 550.

The first and second sampling capacitors 471, 472 provide a bias signal to a fifth plurality of transistors 488, 489 which are, in turn, coupled to positive and negative voltage output terminals ($V_{OUT}+$, $V_{OUT}-$) 308, 309 when the differential amplifier 300 is in R/H Mode. Otherwise (in I/S Mode), a common-mode bias signal is provided by the transistors 475, 476, 560, 565, which are biased ON.

The sample and hold portion 470 also includes two bias circuits 500, 550 for biasing of the differential integrated voltage $V_{INT}(+)$, $V_{INT}(-)$ from the integration feedback portion 440. Each of the bias circuits 500 (550) includes a first plurality of transistors 501–506 (551–556) which are coupled to first and second resistors 580, 585 (590, 595), and a second plurality of transistors 510, 515 (560, 565). The bias circuits 500 (550) are coupled to respective first (473, 474) and third (484, 485) pluralities of transistors at the midpoint between the resistors 580, 585 (590, 595). The first and third pluralities of transistors (473–476, 484, 485) and the resistors (580, 585, 590, 595) providing biasing for the bias circuits 500, 550. For example, if bias is steered into the resistors 580,585 (590,595) then the emitters of 510, 515 (560, 565) will be lower in potential, if bias is not steered into the resistors 580,585 (590,595), the current sources that are comprised of the transistors 478, 490 (481, 491) will set the voltage at the emitters of 510, 515 (560, 565) much higher.

As noted above, an "integrated" differential voltage is provided on the input (i.e., left side) of the sampling capacitors 471, 472 just prior to switching from I/S Mode to R/H Mode. Upon switching to R/H Mode, the voltage at the input to the sampling capacitors 471, 472 is clamped to zero (0) Volts (V) in differential mode (i.e., both capacitors are clamped to a voltage slightly higher than the Common Mode voltage specified by the CMFB circuit 240). For example, just prior to switching to R/H Mode, the voltage at the input to the sampling capacitors 471, 472 is approximately 1.6V (i.e., the Common Mode voltage), but when the sampling capacitors are clamped, the new voltage is set by the voltage at the emitter terminals of the transistors 510 and 515, as described above. When this occurs, the base-emitter voltage ($V_{be}$) of the transistors 458 and 461 is reduced which turns them "OFF."

The sampling capacitors 471, 472 respond to the transient change in voltage, and therefore the difference between the voltages at switching time is translated to the output of the sampling capacitors. Just prior to switching from I/S Mode to R/H Mode, the output of the sampling capacitors 471, 472 was clamped at a common mode voltage (set by the voltage at the emitter terminals of the transistors 560 and 565), and this voltage is released when switching modes, so that the output voltage on, for example, the positive side (e.g., at positive voltage output terminal ($V_{OUT}+$) 308) is defined by the following equation:

$V_{OUT}+=[V_{CL}+]+[V_{CR}+]-[V_{INT}(+)]$, where $V_{CR}+$ is the voltage on the right side of the capacitor (e.g., capacitor 472)

and the voltage on, for example, the negative side (at negative voltage output terminal ($V_{OUT}-$) 309) is defined by the following equation:

$V_{OUT}-=[V_{CL}-]+[V_{CR}]-[V_{INT}(-)]$, where $V_{CR}-$ is the voltage on the right side of the capacitor (e.g., capacitor 471)

For example, considering the situation where:

$V_{CL}+/-=V_{CR}+/-=2.0V$, $V_{INT}(+)=1.6V$ (DC)+100 mV (AC), and $V_{INT}(-)=1.6V$ (DC)-100 mV (AC), then $V_{OUT}+=2.0V+2.0V-[1.6V$ (DC)+100 mV (AC)] $=2.3V$, and $V_{OUT}-=2.0V+2.0V-[1.6V$ (DC)-100 mV (AC)] $=2.5V$, The output voltages $V_{OUT}+$ and $V_{OUT}-$ may be used in a radar-based sensor system, such as the system described above with reference to U.S. Pat. No. 6,587,072. Particularly, the voltage difference ($\Delta V$) between $V_{OUT}+$ and $V_{OUT}-$ may comprise the integrated value of the correlation of the transmitted and received pulses. As will be understood by those of ordinary skill in the art, this difference voltage signal $\Delta V$ may be applied to an Analog to Digital Converter (ADC) and further processed to determine the distance of the object which reflected the transmitted radar signal.

Figure 6:
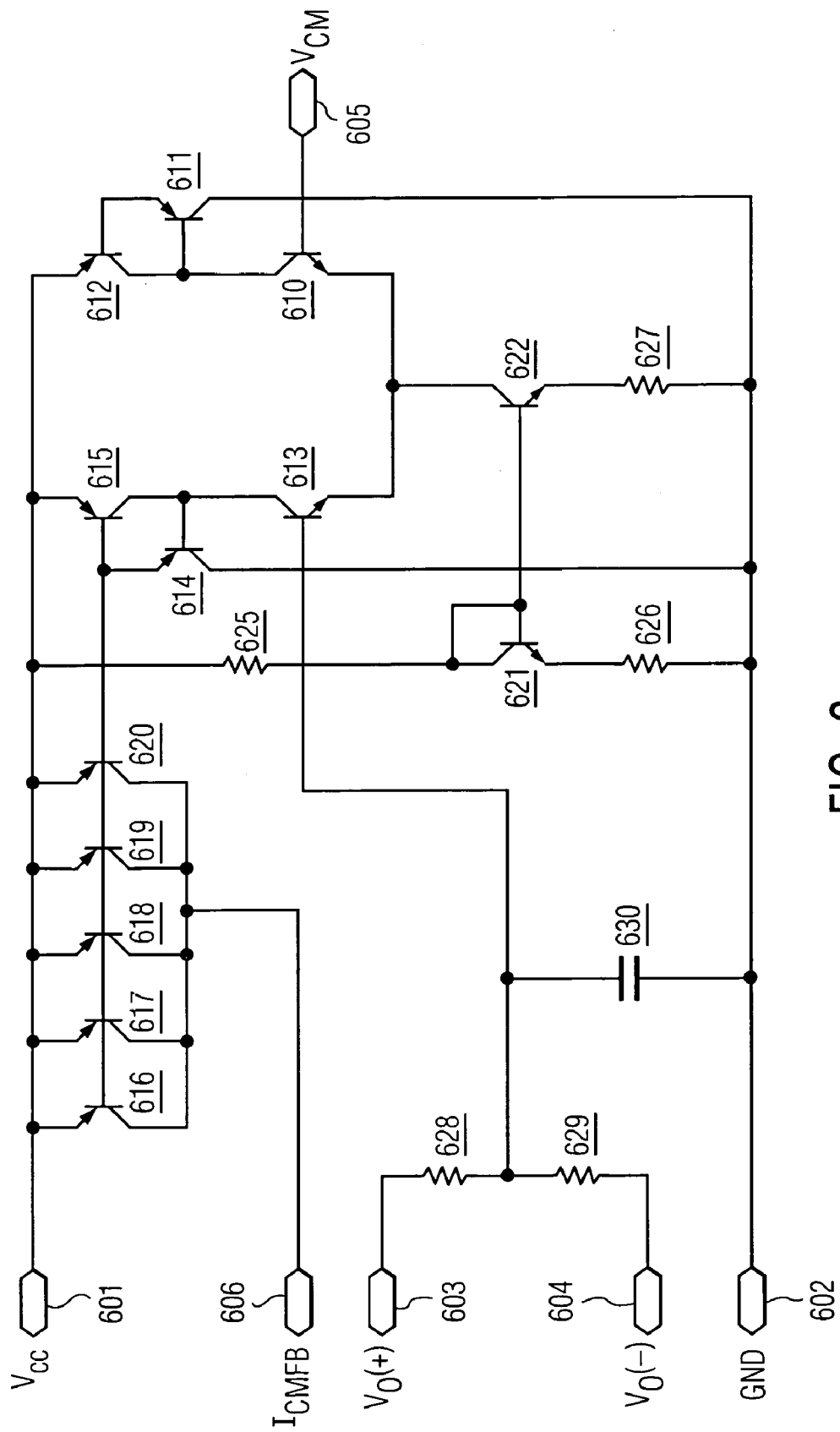
FIG. 6 shows a circuit diagram of a Common Mode Feedback Circuit (CMFB) circuit according to an exemplary embodiment of the present invention.

FIG. 6 shows a circuit diagram of a Common Mode Feedback Circuit (CMFB) circuit 600 (e.g., CMFB circuit 240 discussed above with reference to FIG. 3) according to an exemplary embodiment of the present invention. The CMFB circuit 600 operates in conjunction with the above-described receive circuit 400 to specify a common mode voltage. The CMFB circuit 600 includes a power terminal ($V_{CC}$) 601, and a ground terminal (GND) 602. The CMFB circuit 600 also includes differential voltage input terminals ($V_0+$, $V_0-$) 603, 604, and a common mode voltage input terminal ($V_{CM}$) 605.

The common mode voltage input terminal ($V_{CM}$) 605 specifies a particular common mode voltage which is provided to a differential amplifier (e.g., differential amplifier 300 in FIG. 3; amplifier portion 410 and integration feedback portion 440) via an output terminal ($I_{CMFB}$) 606. In particular, the output terminal ($I_{CMFB}$) 606 provides an output current ($I_{CMFB}$) for regulating the common mode voltage of an integrated waveform produced by the differential amplifier. More specifically, the CMFB circuit 240 will set the voltage at the input (left) side of sampling capacitors 471, 472 (of the sample and hold portion 470 shown in FIG. 4) to the common mode voltage supplied at the common mode voltage input terminal ($V_{CM}$) 605. Accordingly, a current is presented at the output of the Common Mode Feedback Circuit (CMFB) circuit 600 based on a differential voltage presented at differential voltage input terminals ($V_0+, V_0-$) 603, 604, which is $1.6V+V_{IN}(+)$ on the positive side, and $1.6V-V_{IN}(-)$ on the negative side.

The output common mode voltage at the input of the capacitors 471, 472 is specified because the buffer transistors 441, 444, 453, 455, 458, and 461 are identical, and therefore the path from the base terminal of transistor 441 to the emitter terminal of transistor 441 is identical to the path from the base terminal of transistor 458 to the emitter terminal of transistor 458, and thus the common mode voltage is identical to that at the compensating capacitor voltage terminals ($V_{OCC}+, V_{OCC}-$) 310, 311 of the differential amplifier 300 (which are the emitter terminals of transistors 441 and 444). The output current $I_{CMFB}$ is coupled to the differential amplifier (e.g., differential amplifier 300 in FIG. 3) at a reference current input terminal (e.g., reference current input terminal ($I_{REF}$) 307 in FIG. 3).

The voltage applied to the common mode voltage input terminal ($V_{CM}$) 605 is first applied to the base of a first transistor 610. A collector terminal of the first transistor 610 is coupled to the base terminal of a second transistor 611 and the collector terminal of a third transistor 612. The emitter terminal of the third transistor 612 is coupled to the power terminal ($V_{CC}$) 601 of the CMFB circuit 600, which provides a voltage thereto. Opposite the first through third transistors 610–612 are fourth through sixth transistors 613–615 which are disposed differentially. For example, if transistor 622 produces 500 microamps (µA) of current (as being 'mirrored' from transistor 621), there is only 500 µA available for both arms of the differential pair comprised of the transistors 610 and 613. So, in terms of static operation, there are 250 µA in one side (e.g., transistor 610), and 250 µA in the other side (e.g., transistor 613). Thus, if the base voltage of the transistors 610 and 613 change relative to one another (e.g., one base voltage is higher than the other), then the transistor that is at a higher base voltage will have more current than the other.

A first group of transistors 616–620 are coupled to the power terminal ($V_{CC}$) 601 of the CMFB circuit 600, and the base terminal of the sixth transistor 615. Ideally, the current through transistor 616–620 is equal to five (5) times the current in the transistors 615 and 613, since there are five (5) times as many transistors. A seventh transistor 621 is coupled to the power terminal ($V_{CC}$) 601 of the CMFB circuit 600 through a first resistor 625. An emitter terminal of the seventh transistor 621 is coupled to a second resistor 626. The transistors 616–621, along with the resistors 625 and 626 set the bias current of the CMFB circuit 600. An eighth transistor 622 is coupled to the emitter terminals of the first and fourth transistors 610, 613, and has its emitter terminal coupled to a third resistor 627. The seventh transistor 621 acts as a 'current mirror' to produce a mirrored current in the eighth transistor 622.

The operation of the CMFB circuit 600 is as follows. As will be noted, the differential voltage input terminals ($V_0+, V_0-$) 603, 604 of the CMFB circuit 600 are respectively coupled to fourth and fifth resistors 628, 629, and to the base of the transistor 613. Any difference ($\Delta V$) between the voltages at the bases of the transistors 610 and 613 will result in a difference in collector currents between the transistors 612 and 615 (and also the transistors 610 and 613). Specifically, if $V_{CM}$ is greater than the voltage at the base of the transistor 613 ($V_{b613}$), then the collector currents of the transistors 610 and 612 will be greater than the collector currents of the transistors 613 and 615. The current in the transistor 615 is mirrored in the transistors 616–620 and is ultimately delivered to the transistors 413 and 419 of the amplifier portion 410 through the reference current input terminal ($I_{REF}$) 307 as common mode control current $I_{CMFB}$ (See FIG. 4).

Under the condition mentioned above ($V_{CM} > V_{b613}$), as the current through the transistors 411 and 412 decreases, the common mode voltage at the resistors 417 and 418 increases. The increased common mode voltage at the resistors 417 and 418 is fed through the buffer transistors 441 and 444 and is provided at the compensating capacitor voltage terminals ($V_{OCC}+, V_{OCC}-$) 310, 311 of the differential amplifier 300. The increased common mode voltage present at the compensating capacitor voltage terminals ($V_{OCC}+, V_{OCC}-$) 310, 311 is, in turn, coupled to the common mode differential voltage input terminals ($V_0+, V_0-$) 603, 604. The common mode differential voltage input terminals ($V_0+, V_0-$) 603, 604 are coupled, through the resistors 628 and 629 to the base of the transistor 613. Thus, the increased common mode voltage is now present at the base of the transistor 613, where previously a decreased (i.e. less than $V_{CM}$) voltage was presented.

Similarly, if an increase in the collector currents of the transistors 613, 615 occurs, a corresponding decrease in the common mode voltage at the resistors 417 and 418 occurs, and the above operations occur to present a decreased common mode voltage at the base of the transistor 613. Eventually, a point is reached where the voltage at the compensating capacitor voltage terminals ($V_{OCC}+, V_{OCC}-$) 310, 311 (and consequently the common mode differential voltage input terminals ($V_0+, V_0-$) 603, 604) is equal to the common mode voltage ($V_{CM}$) at the common mode voltage input terminal ($V_{CM}$) 605 (e.g., 1.6 Volts).

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. A circuit comprising:
   a differential amplifier; and,
   at least one common mode feedback circuit coupled to the differential amplifier for providing at least a first and second control currents to the differential amplifier for regulating a common mode voltage of the differential amplifier,
   wherein the differential amplifier is operable in at least one of at least two modes, such that in a first mode of the at least two modes the differential amplifier is operable to perform integration of a signal, and in a second mode of the at least two modes the differential amplifier is operable to hold at least one sample representative of a previously integrated signal.

2. The circuit of claim 1, further comprising at least one capacitor and at least one resistor coupled to the differential amplifier for integrating a voltage signal applied to the differential amplifier.

3. The circuit of claim 1, wherein the differential amplifier includes at least two differential voltage input terminals and at least two differential control voltage terminals.

4. The circuit of claim 1, wherein the differential amplifier includes at least one capacitor for storing a voltage value representing the result of an integration of a portion of the signal.

5. The circuit of claim 1, wherein the differential amplifier comprises:
   an amplifier portion for amplifying an input signal;
   an integration portion for integrating the input signal; and,
   a sample and hold portion for sampling and holding at least one voltage value resulting from the integration of the input signal.

6. The circuit of claim 5, wherein the sample and hold portion includes at least two capacitors for storing voltage values resulting from the integration of the input signal.

7. The circuit of claim 3, wherein the at least two differential control voltage terminals permit selection of one of the at least two modes.

8. A circuit comprising:
   an amplifier portion for amplifying an input signal to produce an amplified input signal;
   an integration portion for integrating the amplified input signal to produce an integrated signal; and,
   a sample and hold portion for sampling and holding at least one voltage value representing a portion of the integrated signal,
   wherein the circuit is operable in at least one of at least two modes associated with at least a first and second control currents, such that in a first mode of the at least two modes the circuit is operable to perform integration of the amplified input signal, and in a second mode of the at least two modes the circuit is operable to hold at least one sample representative of a previously integrated signal.

9. The circuit of claim 8, wherein the circuit includes at least two differential voltage input terminals and at least two differential control voltage terminals.

10. The circuit of claim 9, wherein the at least two differential control voltage terminals permit selection of one of the at least two modes.

11. A radar-based sensor system comprising:
   a transmitter; and
   a receiver, said receiver comprising a differential amplifier and at least one common mode feedback circuit coupled to the differential amplifier for providing at least a first and second control currents to the differential amplifier for regulating a common mode voltage of the differential amplifier, wherein the differential amplifier is operable in at least one of at least two modes, such that in a first mode of the at least two modes the differential amplifier is operable to perform integration of a signal, and in a second mode of the at least two modes the differential amplifier is operable to hold at least one sample representative of a previously integrated signal.

\* \* \* \* \*